US012205040B2

(12) United States Patent
Bae et al.

(10) Patent No.: US 12,205,040 B2
(45) Date of Patent: Jan. 21, 2025

(54) METHOD OF TRAINING DEEP LEARNING MODEL FOR PREDICTING PATTERN CHARACTERISTICS AND METHOD OF MANUFACTURING SEMICONDUCTOR DEVICE

(71) Applicant: SAMSUNG ELECTRONICS CO., LTD., Suwon-si (KR)

(72) Inventors: Yoonsung Bae, Seoul (KR); Seungho Gwak, Seoul (KR); Kwangrak Kim, Gunpo-si (KR); Seunggun Byoun, Suwon-si (KR); Gilwoo Song, Hwaseong-si (KR); Younghoon Shin, Yongin-si (KR); Kyungwon Yun, Hwaseong-si (KR); Chiyoung Lee, Seoul (KR); Taeyong Jo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 937 days.

(21) Appl. No.: 17/245,173

(22) Filed: Apr. 30, 2021

(65) Prior Publication Data
US 2022/0121956 A1    Apr. 21, 2022

(30) Foreign Application Priority Data
Oct. 16, 2020    (KR) .................. 10-2020-0134610

(51) Int. Cl.
*G06N 3/088* (2023.01)
*G06N 3/042* (2023.01)
(Continued)

(52) U.S. Cl.
CPC ............. *G06N 3/088* (2013.01); *G06N 3/042* (2023.01); *G06N 3/045* (2023.01); *G06N 3/0675* (2013.01); *H01L 22/12* (2013.01)

(58) Field of Classification Search
CPC ........ G06N 3/088; G06N 3/042; G06N 3/045; G06N 3/0675; H01L 22/12
See application file for complete search history.

(56) References Cited

U.S. PATENT DOCUMENTS 6,690,473 B1 * 2/2004 Stanke .................... B24B 37/34
356/369
7,567,351 B2 * 7/2009 Opsal ................. G01B 11/0641
356/369
(Continued)

FOREIGN PATENT DOCUMENTS

CN      108700823 A * 10/2018  ............. G03F 7/705
CN      110313059 A * 10/2019  ......... G01B 11/0625
(Continued)

OTHER PUBLICATIONS

Wang, Junliang, et al., "AdaBalGAN: An improved generative adversarial network with imbalanced learning for wafer defective pattern recognition," IEEE Transactions on Semiconductor Manufacturing 32.3 (2019): 310-319 (Year: 2019).*

*Primary Examiner* — Shahid K Khan
(74) *Attorney, Agent, or Firm* — Muir Patent Law, PLLC

(57) ABSTRACT

A method of manufacturing a semiconductor device includes forming a pattern on a wafer, measuring a spectrum of the pattern on the wafer, with a spectral optical system, performing an analysis of the spectrum through a deep learning model for predicting pattern characteristics, the deep learning model being trained based on a domain knowledge, and evaluating the pattern on the wafer based on the analysis of the spectrum, wherein the domain knowledge includes a noise inducing factor of the spectral optical system.

20 Claims, 9 Drawing Sheets

(51) Int. Cl.
  *G06N 3/045* (2023.01)
  *G06N 3/067* (2006.01)
  *H01L 21/66* (2006.01)

(56) References Cited

U.S. PATENT DOCUMENTS

| | | |
|---|---|---|
| 8,577,820 B2 | 11/2013 | Jin et al. |
| 10,365,085 B2 | 7/2019 | Wu et al. |
| 10,386,729 B2 * | 8/2019 | Lee .................... G03F 7/70616 |
| 10,664,955 B2 | 5/2020 | Mack |
| 2002/0107650 A1* | 8/2002 | Wack ..................... G01N 21/47 702/81 |
| 2005/0185197 A1* | 8/2005 | Tao ......................... H01L 22/12 356/625 |
| 2010/0094790 A1 | 4/2010 | Gnojewski |
| 2015/0219446 A1 | 8/2015 | Leem et al. |
| 2017/0109646 A1* | 4/2017 | David ................. G03F 7/70625 |
| 2017/0351952 A1* | 12/2017 | Zhang .................. G06V 10/764 |
| 2018/0232630 A1* | 8/2018 | Chen ...................... H01L 22/20 |
| 2019/0148246 A1 | 5/2019 | Zhan et al. |
| 2020/0193290 A1* | 6/2020 | Cho ........................ C23C 16/52 |
| 2020/0218844 A1* | 7/2020 | Feng ....................... G03F 7/705 |

FOREIGN PATENT DOCUMENTS

| | | | | |
|---|---|---|---|---|
| CN | 110383177 A | * | 10/2019 | ......... G03F 7/70441 |
| JP | 2018534758 A | * | 11/2018 | |
| JP | 6751871 B2 | * | 9/2020 | ............. G03F 7/705 |
| JP | 6853273 B2 | * | 3/2021 | ............. G06K 9/6274 |
| KR | 20130094836 A | * | 8/2013 | |
| KR | 20210052430 A | * | 5/2021 | |
| TW | 201448081 A | * | 12/2014 | ......... G03F 7/70558 |
| WO | WO-9945340 A1 | * | 9/1999 | ........ G01B 11/0641 |
| WO | WO-2018053031 A1 | * | 3/2018 | ............. G01N 21/88 |
| WO | WO-2020078762 A1 | * | 4/2020 | ............. G03F 7/705 |

* cited by examiner

METHOD OF TRAINING DEEP LEARNING MODEL FOR PREDICTING PATTERN CHARACTERISTICS AND METHOD OF MANUFACTURING SEMICONDUCTOR DEVICE

CROSS-REFERENCE TO RELATED APPLICATION

Korean Patent Application No. 10-2020-0134610, filed on Oct. 16, 2020 in the Korean Intellectual Property Office, and entitled: "Method of Training Deep Learning Model for Predicting Pattern Characteristics and Method of Manufacturing Semiconductor Device," is incorporated by reference herein in its entirety.

BACKGROUND

1. Field

Embodiments relate to a method of training a deep learning model for predicting pattern characteristics and a method of manufacturing a semiconductor device.

2. Description of the Related Art

As manufacturing operations of semiconductor devices have become highly integrated, a three-dimensional profile measurement technology for semiconductor fine patterns or complex structures is being developed. Recently, in the case of memory and logic products, a fine operation technology having a line width of 10 nm or less has been used, and the importance of a technology monitoring a fine pattern formation operation for improving manufacturing yield and quality is increasing. The speed of operation monitoring is an important factor in determining the productivity of manufacturing semiconductor devices. Accordingly, among non-destructive inspections that may completely inspect a substrate, the importance of an optical method having an excellent inspection speed is emerging.

SUMMARY

According to an aspect of embodiments, there is provided a method of manufacturing a semiconductor device, the method including forming a pattern on a wafer, measuring, with a spectral optical system, a spectrum of the patterned wafer, analyzing the spectrum through a deep learning model for predicting pattern characteristics, wherein the deep learning model is trained based on domain knowledge, and evaluating the pattern on the wafer based on the analysis of the spectrum, wherein the domain knowledge includes a noise inducing factor of the spectral optical system.

According to another aspect of embodiments, there is provided a method of training a deep learning model for predicting pattern characteristics, the method including measuring a spectrum of a patterned wafer and a critical dimension of the pattern corresponding to the spectrum, generating augmented spectra based on the spectrum and domain knowledge, selecting a wavelength band to be used for the training of the deep learning model for predicting pattern characteristics with respect to the spectrum and the augmented spectra, and training the deep learning model for predicting pattern characteristics b using the spectrum and the augmented spectra as an input and using the critical dimension of the pattern as an output.

According to yet another aspect of embodiments, there is provided a method of manufacturing a semiconductor device, the method including training a deep learning model for predicting pattern characteristics based on domain knowledge, measuring, with a spectral optical system, a spectrum of a patterned wafer, analyzing the spectrum through the deep learning model for predicting pattern characteristics, and evaluating the pattern on the wafer based on the analysis of the spectrum, wherein the training of the deep learning model for predicting pattern characteristic is performed based on augmented spectra generated based on the spectrum generated from a measurement of the spectral optical system and the domain knowledge.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
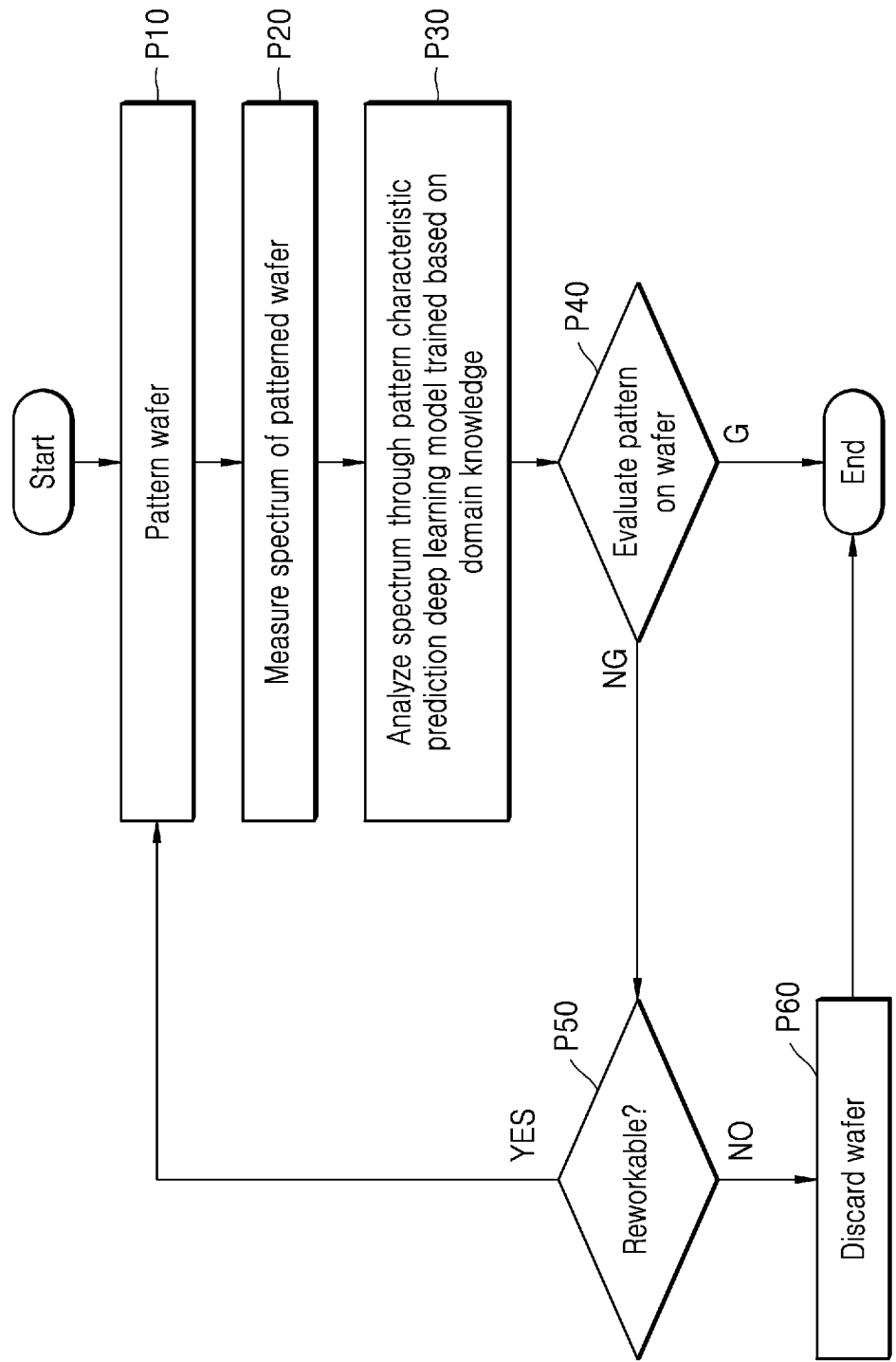
FIG. 1 is a flowchart of a method of manufacturing a semiconductor device, according to example embodiments.
Figure 2:
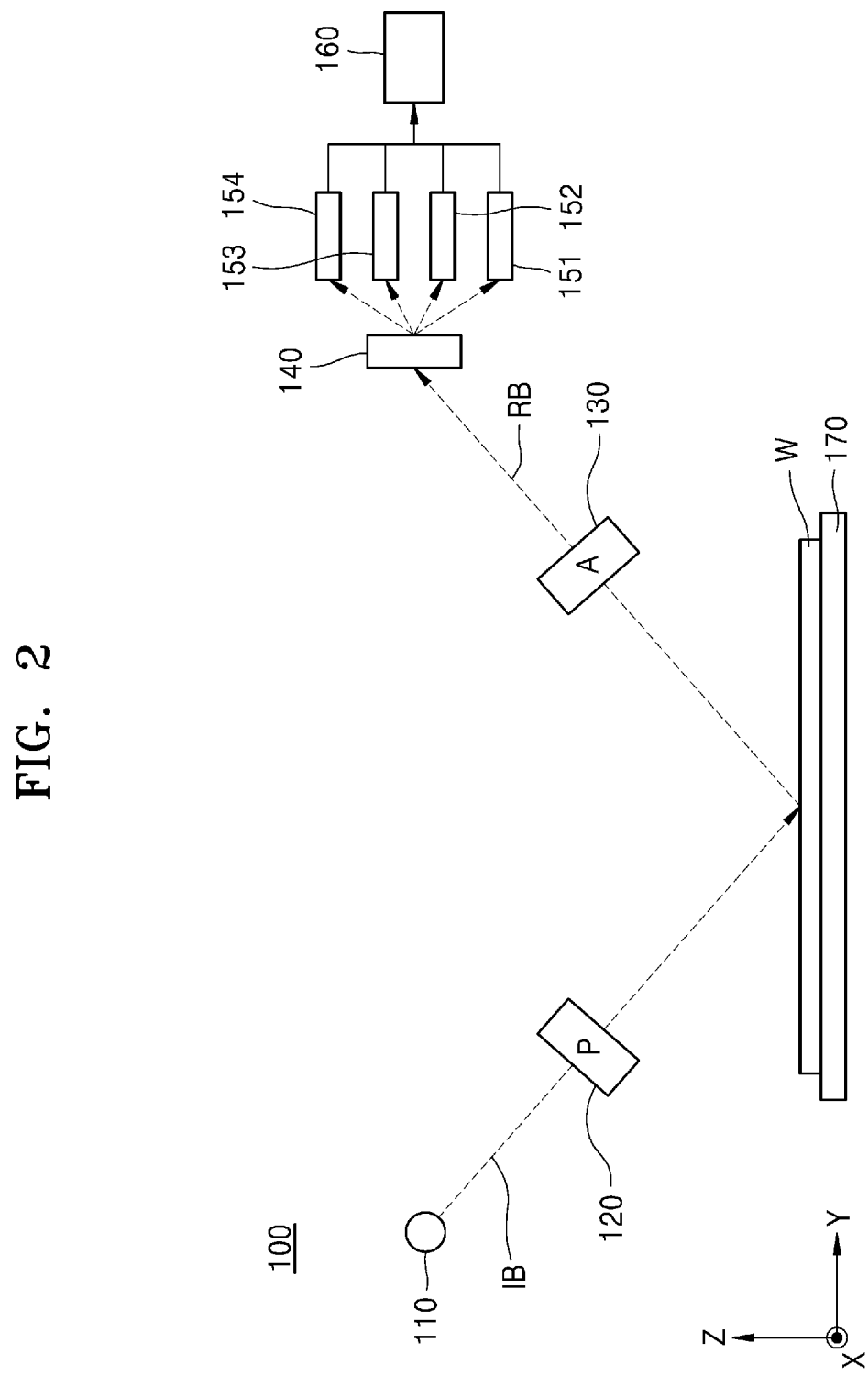
FIG. 2 is a schematic diagram of a wafer inspection device according to example embodiments.

FIG. 1 is a flowchart of a method of manufacturing a semiconductor device, according to example embodiments. FIG. 2 is a schematic diagram of a wafer inspection device 100 according to example embodiments.

Referring to FIG. 1, in P10, a wafer W may be patterned. Patterning a wafer may include patterning a photoresist layer through a development operation and patterning a material layer on the wafer by using the patterned photoresist layer.

The wafer may include, e.g., silicon (Si). A wafer may include a semiconductor element, e.g., germanium (Ge), or a compound semiconductor, e.g., silicon carbide (SiC), gallium arsenide (GaAs), indium arsenide (InAs), and/or indium phosphide (InP). According to some embodiments, the wafer may have a silicon-on-insulator (SOI) structure. The wafer may include a buried oxide layer. According to some embodiments, the wafer may include a conductive region, e.g., a well doped with impurities. According to some embodiments, the wafer may have various device isolation structures, e.g., a shallow trench isolation (STI) separating doped wells from each other.

The patterning of the photoresist layer may be performed by a lithographic operation. The lithographic operation is an operation of transferring a circuit pattern previously formed on a lithographic mask onto a wafer. The lithographic operation may include a spin coating operation providing a photoresist layer on a wafer, a light exposure operation of irradiating a portion of the photoresist layer with ultraviolet rays or extreme ultraviolet rays, and a development operation of removing an exposed portion or an unexposed portion of the photoresist layer.

The material layer between the wafer and the photoresist layer may be etched by dry etching or wet etching. A dry etching operation may be, e.g., any of reactive ion etching (RIE), deep RIE (DRIE), ion beam etching (IBE), and argon (Ar) milling. As another example, the dry etching operation, which may be performed on the wafer, may be atomic layer etching (ALE). In addition, a wet etching operation, which may be performed on the wafer, may be an etching operation using at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS as an etchant gas.

Next, referring to FIGS. 1 and 2, in P20, a spectrum of the patterned wafer W may be measured. The spectrum may be measured by the wafer inspection device 100 of a spectral ellipsometer type shown in FIG. 2, but is not limited thereto. For example, the spectrum may be measured by a spectral reflectometer.

Hereinafter, for convenience of explanation, an embodiment in which the spectrum is measured by a spectral ellipsometer will be described below. However, the embodiment is for convenience of explanation only.

The wafer inspection device 100 may inspect a pattern formed on the wafer W by at least one of the above-stated operations. The wafer inspection device 100 may determine any one of a critical dimension of the formed pattern, a height of the pattern, a recess, an overlay, and a defect. Herein, the overlay is a quantity indicating a degree of misalignment between an underlying layer formed on the wafer W before performing a patterning operation and a photoresist pattern.

A light source 110 may generate an incident beam IB and emit the generated light toward the wafer W. The incident beam IB generated by the light source 110 may be unpolarized light. However, embodiments are not limited thereto, and the incident beam IB may be polarized light. The incident beam IB may be incident in a direction inclined, e.g., at an oblique angle, with respect to an upper surface of the wafer W.

A wavelength of the incident beam IB may be in a wavelength band within a set range. According to some embodiments, the incident beam IB may be a visible light beam. According to some embodiments, the wavelength of the incident beam IB may be about 400 nm to about 800 nm. According to some other embodiments, the incident beam IB may be a near-infrared ray or an infrared ray. According to some embodiments, the wavelength band of the incident beam IB may be about 800 nm to about 3000 nm. The light source 110 may emit the incident beam IB having a particular wavelength, simultaneously emit the incident beam IB having several wavelengths, or emit the incident beam IB having a set wavelength band. The light source 110 may also emit the incident beam IB having a wavelength that changes according to time.

A polarizer 120 may be arranged on a path of the incident beam IB between the light source 110 and the wafer W. For example, when the incident beam IB emitted from the light source 110 is unpolarized, the incident beam IB is linearly polarized by passing through the polarizer 120. In another example, when the incident beam IB emitted from the light source 110 is polarized, the incident beam IB passes through the polarizer 120 to rotate its polarization direction. The polarizer 120 may determine the polarization direction of the incident beam IB. The incident beam IB that has passed through the polarizer 120 may include only a polarization component parallel to a polarization axis of the polarizer 120.

According to example embodiments, a compensator, e.g., a retarder or a quarter wave plate, may be further arranged on an optical path between the polarizer 120 and the wafer W. Herein, the compensator may adjust a phase difference Δ of the incident beam IB.

When the incident beam IB is incident on the wafer W, a reflected beam RB is reflected by the wafer W. The reflected beam RB may reach a light branching device 140. An analyzer 130 may be arranged on an optical path between the light branching device 140 and the wafer W.

The analyzer 130 may adjust a polarization direction of the reflected beam RB reflected by the wafer W. In some cases, an imaging lens may be further arranged on an optical path (e.g., between the analyzer 130 and the wafer W) of the reflected beam RB. The imaging lens may adjust chromatic aberration of the reflected beam RB.

The light branching device 140 may be, e.g., a prism formed by processing a transparent material such as quartz, or may be a diffraction grating. The reflected beam RB may be divided, by the light branching device 140, into a plurality of beams having different wavelengths from each other. Accordingly, a plurality of detectors 151, 152, 153, and 154 may detect the plurality of beams having different wavelengths from each other. For convenience of explanation, four detectors 151, 152, 153, and 154 are shown in FIG. 2, but embodiments are not limited thereto, e.g., two or more detectors may be provided.

The spectrum detected by the plurality of detectors 151, 152, 153, and 154 may be analyzed by a processor 160. The processor 160 may determine any one of a critical dimension of a pattern formed on the wafer W, a height of the pattern, a recess, an overlay, and a defect.

The processor 160 may be a computing device, e.g., a workstation computer, a desktop computer, a laptop computer, a tablet computer, or the like. The processor 160 may be a simple controller, e.g., a microprocessor, a complex processor, e.g., a central processing unit (CPU), a graphics processing unit (GPU), or the like, a processor formed by software, dedicated hardware, or firmware. The processor 160 may be implemented by, e.g., a general-purpose computer, a digital signal processor (DSP), or application specific hardware, e.g., a field programmable gate array (FPGA), an application specific integrated circuit (ASIC), or the like.

According to some embodiments, an operation of the processor 160 may be implemented as commands stored on a machine-readable medium that may be read or executed by at least one processor. Herein, the machine-readable medium may include any mechanism for storing and/or transmitting information in a form readable by a machine (e.g., a computing device). For example, the machine-readable medium may include read only memory (ROM), random access memory (RAM), a magnetic disc storage medium, an optical storage medium, flash memory, electrical, optical, acoustic or other forms of radio signals (e.g., a carrier wave, an infrared signal, a digital signal, or the like), and other arbitrary signals.

In addition, firmware, software, routines, commands performing operations described with respect to the processor 160 or any operation to be described below may be configured. For example, the processor 160 may be implemented by a deep learning model for predicting pattern characteristics, the deep learning model being trained based on an original spectrum measured by the plurality of detectors 151, 152, 153, and 154, an augmented spectrum generated based on the original spectrum, and a characteristic (e.g., a critical dimension) of a pattern on the wafer W. The processor 160 may be implemented by a deep learning model for predicting pattern characteristics configured to calculate, after being trained, a characteristic (e.g., a critical dimension) of a pattern on the wafer W based on a spectrum of the wafer W.

However, this is for convenience of explanation, and an operation of the processor 160 described above may be performed by a computing device, a processor, a controller, or another device that executes firmware, software, routines, commands, or the like.

A stage 170 may support the wafer W, which is an inspection target. Herein, two directions parallel to an upper surface of the stage 170 and perpendicular to each other are respectively defined as an X direction and a Y direction, and a direction perpendicular to the upper surface of the stage 170 is defined as a Z direction. The stage 170 may translate the wafer W in the X direction, the Y direction, and the Z direction, or may rotate the wafer W with the Z direction as an axis. For example, the wafer W may move the wafer W in the Z direction so that the incident beam IB is focused near a surface of the wafer W. The stage 170 may rotate the wafer W with the Z direction as an axis or move the wafer W in the X direction and the Y direction so that the incident beam IB is irradiated onto a set position on the wafer W.

Spectroscopic ellipsometry is an optical inspection method of specular or regular reflection such as an incident angle and a reflection angle, and an incident beam and a reflected beam spin the same plane (e.g., a plane of incidence). Polarized light in a direction parallel to the plane of incidence is referred to as p-polarized light, and polarized light in a direction perpendicular to the p-polarized light is referred to as s-polarized light.

The spectroscopic ellipsometry measures a complex reflectance $\rho$ that may be parameterized by a reflection amplitude ratio $\Psi$ and a phase difference $\Delta$. A polarization state of light incident on a sample may be decomposed into s and p components. Amplitudes of s and p components after reflection, which are normalized to initial values, are denoted by rs and rp, respectively. In this case, rs, rp, and the complex reflectance $\rho$ satisfy Equation 1 below.

$$\rho = \frac{rp}{rs} = \tan\Psi \cdot e^{i\Delta} \quad \text{[Equation 1]}$$

A difference between rp and rs may be maximized by selecting an angle of incidence of light close to a Brewster's angle of a sample. Because the spectroscopic ellipsometry measures a ratio (or difference) of two values, the spectroscopic ellipsometry may provide rigorous and reproducible measurement results. Accordingly, the spectroscopic ellipsometry is relatively insensitive to light scattering and changes under inspection conditions, and has an advantage of not requiring a standard sample and a reference ray.

In addition, a parameter $\alpha$ and a parameter $\beta$ may be calculated from the reflection amplitude ratio $\Psi$ and the phase difference $\Delta$ according to Equation 2 below.

$$\alpha = -\cos 2\Psi, \beta = \sin 2\Psi \cos \Delta \quad \text{[Equation 2]}$$

Subsequently, referring to P30, the spectrum may be analyzed through a deep learning model for predicting pattern characteristics, wherein the deep learning model is trained based on domain knowledge. The deep learning model for predicting pattern characteristics may be included in the processor 160 of the wafer inspection device 100, but is not limited thereto. For example, the deep learning model may be included in an external server configured to communicate with the processor 160.

The deep learning model being trained based on domain knowledge means that the deep learning model is trained by considering physical characteristics of a wafer inspection device for measuring a spectrum. For example, the deep learning model may be trained based on an augmented spectrum generated based on a systematic error of the wafer inspection device 100 such as alignment errors of the plurality of detectors 151, 152, 153, and 154, alignment errors of the polarizer 120 and the analyzer 130, or the like. Hereinafter, for convenience of explanation, factors that cause unwanted spectral changes, such as the alignment errors of the plurality of detectors 151, 152, 153, and 154, an angular alignment error between the polarizer 120 and the analyzer 130, or the like, are referred to as noise parameters, i.e., noise inducing factors. The noise parameters may further include, e.g., an angle of incidence (AOI) drift due to misalignment of the light source 110, misalignment of an azimuth (an angle on X, Y planes) of the wafer W, an error in lens aberration (when an additional lens is provided between the polarizer 120 and the wafer W), and defocusing of the incident beam IB with respect to the wafer W according to a position of the stage 170.

An analysis using the deep learning model has an advantage of being able to analyze small signals that are difficult to be detected by a unit in the related art, e.g., by a spectroscopic ellipsometry using a Forouhi-Bloomer model or the like. However, in the semiconductor field, because sufficient data is difficult to be obtained for training, a deep learning model is trained by using a small number of pieces of data. Accordingly, due to overfitting with respect to the training data of a deep learning model for predicting pattern characteristics, the deep learning model for predicting pattern characteristics may be too sensitive to noise mixed in a spectrum, e.g., noise due to a systematic error (e.g., such as misalignment).

The deep learning model for predicting pattern characteristics according to an example embodiment is trained based on an augmented spectrum generated based on a systematic error, so that overfitting of the deep learning model for predicting pattern characteristics may be prevented, and the reliability of the wafer inspection device 100 may be improved.

Next, in P40, a pattern on the wafer W may be evaluated. The evaluation of the pattern on the wafer W may include determining any one of a critical dimension of the pattern, a height of the pattern, a recess, an overlay, and a defect. In P40, when the pattern formed on the wafer W is determined to be good G, the inspection may be terminated and a subsequent operation may be performed on the wafer W.

In P40, when the pattern formed on the wafer W is determined to be not good NG, the wafer inspection device 100 may determine whether to rework, in P50. For example, when a photoresist pattern is determined to be not good, the photoresist pattern may be removed through a strip operation (YES), and the lithographic operation may be performed by returning to P10. On the contrary, when, in P50, a pattern of a non-removable material layer on the wafer W is determined to be not reworkable (NO), the wafer W may be discarded in P60.

Figure 3:
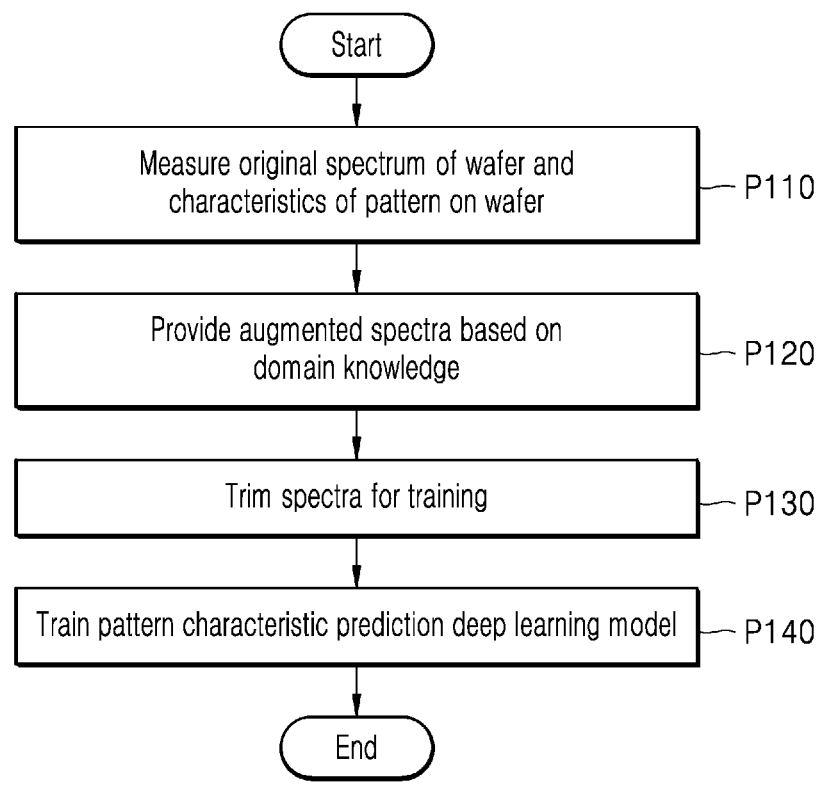
FIG. 3 is a flowchart of a method of training a deep learning model, according to example embodiments.

FIG. 3 is a flowchart of a method of training a deep learning model, according to example embodiments. FIGS. 4 to 7 are schematic diagrams each explaining a method of training a deep learning model, according to example embodiments.

Referring to FIGS. 2 and 3, in P110, a spectrum and a characteristic (e.g., a critical dimension) of a pattern on the wafer W may be obtained. A measurement of the spectrum may be performed by the wafer inspection device 100 of FIG. 2. Hereinafter, a spectrum actually measured by the wafer inspection device 100 is referred to an original spectrum. For example, obtaining of the characteristic of the pattern on the wafer W may be performed by a scanning electron microscope (SEM). Tens to thousands of dies are formed on the wafer W, and the spectrum and the characteristic of the pattern may be measured from a plurality of positions of each wafer W. In addition, the spectrum and the characteristic of the pattern may be measured from a plurality of wafers W, which are different from each other.

Figure 4:
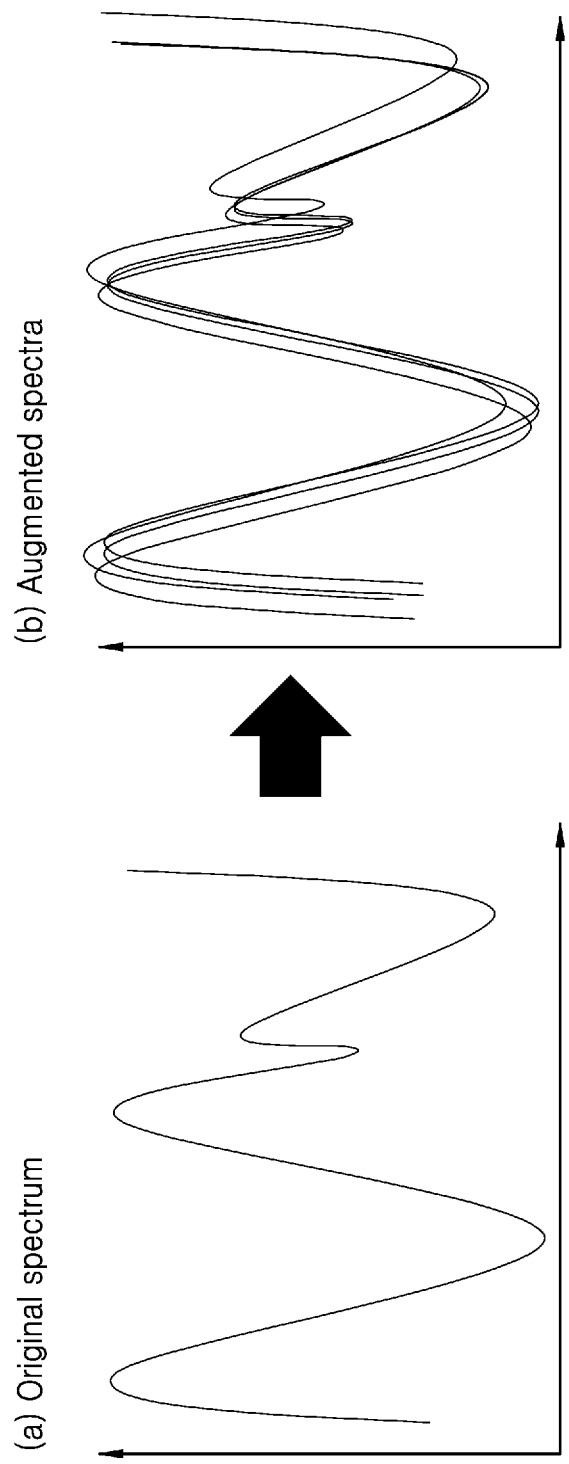
FIGS. 4 to 7 are schematic diagrams of a method of training a deep learning model, according to example embodiments.

Next, referring to FIGS. 2 to 4, augmented spectra may be generated based on domain knowledge in P120. Accordingly, spectra for training including the original spectrum and augmented spectra may be provided. Augmented spectra may be generated based on one original spectrum. The augmented spectra generated based on one original spectrum may share a characteristic (e.g., a critical dimension) of a pattern of the wafer W on which the one original spectrum is measured.

According to some embodiments, generating the augmented spectra based on the domain knowledge may include generating the augmented spectra by physically modeling (i.e., representing analytically) an optical system of the wafer inspection device 100 to compensate for noise parameters of the wafer inspection device 100 and arbitrarily changing correction coefficients for compensating for the noise parameters in the physical modeling.

For example, generating the plurality augmented spectra based on the domain knowledge may include adding a spectrum by performing, with respect to the original spectrum, at least one of wavelength modification modeling for correcting positional misalignment of each of the plurality of detectors 151, 152, 153, and 154, angular modeling for correcting angular misalignment of the polarizer 120 between the analyzer 130, and other correction modeling. Here, misalignment of each of the plurality of detectors 151, 152, 153, and 154 includes mislocation and misorientation of each of the plurality of detectors 151, 152, 153, and 154. Noise parameters compensated for through the other modeling may include, e.g., an AOI drift due to misalignment of the light source 110, defocusing of the incident beam IB due to misalignment of the stage 170, misalignment of an azimuth of the wafer W, and an error of lens aberration when an additional lens is provided.

According to some embodiments, first augmented spectra in which noise due to positional misalignment of the plurality of detectors 151, 152, 153, and 154 is added to the original spectrum may be generated by randomly selecting a correction coefficient in the wavelength modification modeling. According to some embodiments, second augmented spectra in which noise due to angular misalignment of the polarizer 120 between the analyzer 130 is added to the original spectrum may be generated by randomly selecting a correction coefficient in the angular modeling. According to some embodiments, third augmented spectra may be further generated by randomly selecting a correction coefficient in a modeling of other correction parameters included in the domain knowledge.

Herein, the wavelength modification modeling with respect to the original spectrum may be based on Equation 3 below.

$$\delta\lambda = \sum_{n=0}^{n=N} c_n \lambda^n \quad \text{[Equation 3]}$$

In Equation 3, $\delta\lambda$ is a difference between a wavelength measured by a plurality of detectors and an actual wavelength, and $c_n$ is a is a correction coefficient according to a power of the wavelength. That is, the difference $\delta\lambda$ between the wavelength measured by the plurality of detectors and the actual wavelength may be modeled as a polynomial for a wavelength. The correction coefficient $c_n$ may be a value depending on an arrangement of the plurality of detectors 151, 152, 153, and 154.

In addition, correction of the angular misalignment $\Delta\theta$ of the polarizer 120 and the analyzer 130 with respect to the original spectrum may be based on Equation 4 below.

$$\alpha' = \cos(\Delta\theta) \cdot \alpha + \sin(\Delta\theta) \cdot \beta$$

$$\beta' = \sin(\Delta\theta) \cdot \alpha + \cos(\Delta\theta) \cdot \beta \quad \text{[Equation 4]}$$

According to Equation 4, $\alpha'$ and $\beta'$, which are parameters in which the angular misalignment $\Delta\theta$ is compensated for, may be calculated. Based on calculated values of the $\alpha'$ and $\beta'$ parameters and Equation 2, the reflection amplitude ratio $\Psi$ and the phase difference $\Delta$ for each wavelength, in which the angular misalignment $\Delta\theta$ is compensated for, may be calculated. Accordingly, the spectrum in which the angular misalignment $\Delta\theta$ is compensated for may be obtained.

Based on the above-stated wavelength modification modeling, angular modeling, and a single original spectrum shown in (a) of FIG. 4, augmented spectra, shown in (b) of FIG. 4, sharing a characteristic (e.g., a critical dimension) of a pattern may be generated.

According to some other embodiments, adding of a spectrum may also be performed by a deep learning technique that imitates the domain knowledge. The deep learning technique that imitates the domain knowledge will be described with reference to FIG. 5.

Figure 5:
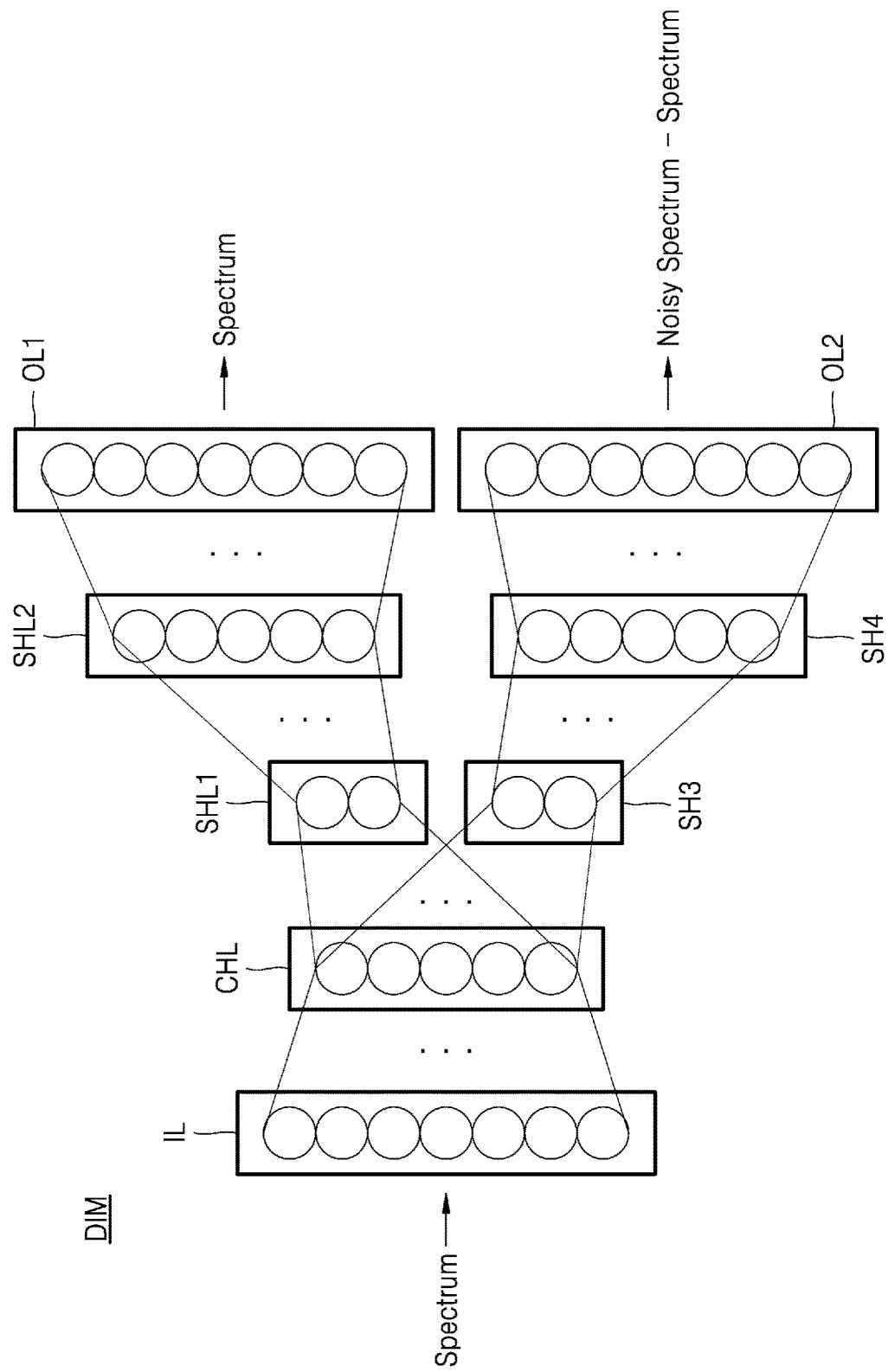

FIG. 5 illustrates a deep learning model DIM that imitates a domain according to example embodiments.

The deep learning model DIM that imitates the domain may be included in the processor 160 (see FIG. 6) or an external server. The deep learning model DIM that imitates the domain may include one input layer IL and first and second output layers OL1 and OL2 branched from the input layer IL. As a non-limiting embodiment, the deep learning model DIM that imitates the domain may further include a shared hidden layer CHL and first to fourth branched hidden layers SHL1, SHL2, SHL3, and SHL4.

According to example embodiments, an original spectrum may be input to the input layer IL. According to example embodiments, the number of features of the input layer IL may be the same as the number of different wavelengths included in a spectrum, but is not limited thereto.

The input layer IL, the shared hidden layer CHL, the first branched hidden layer SHL1, the second branched hidden layer SHL2, and the first output layer OL1 may form an auto encoder. When a spectrum is input to the input layer IL, the first output layer OL1 may output the same spectrum as the input spectrum.

The input layer IL, the shared hidden layer CHL, the third branched hidden layer SHL3, the fourth branched hidden layer SHL4, and the second output layer OL2 may form, for example, a generative adversarial network (GAN). When a spectrum is input to the input layer IL, the second output layer OL2 may output noise of a spectrum according to a change in a noise parameter. Based on the input spectrum and the noise of the spectrum output from the second output layer OL2, the augmented spectra as shown in (b) of FIG. 4 may be provided.

Herein, the GAN may include a generator network and a discriminator network, each of which is a multi-layer perceptron. A goal of the generator network is to generate a simulated spectrum that is close to an actual measured spectrum that may trick a discriminator. A goal of the discriminator network is to actually classify the actual measured spectrum and to classify the simulated spectrum generated by the generator network as false. The discriminator network may be trained to maximize a probability of discriminate training data and data generated by the generator network.

In detail, when the generator network transfers noise calculated using the zero-mean Gaussian distribution to the discriminator network, the discriminator network may be trained to calculate a high probability. The generator network is iteratively updated so that the discriminator network may not separate the actual data and virtual data created by the generator network.

The discriminator network may be trained to calculate a high probability when actual data is input and calculate a low probability when fake data is input. The discriminator network is iteratively updated to better discriminate the actual data and the fake data created by the generator network.

When the discriminator network and the generator network have sufficient capacity, the discriminator network may not discriminate actual data distribution and distribution of data generated by the generator network through several iterations. Accordingly, an expected value of discrimination probability of the discriminator network is ½.

According to example embodiments, all weights between each of features included in the first branched hidden layer SHL1 and each of features included in the fourth branched hidden layer SHL4 may be 0, and all weights between each of features included in the third branched hidden layer SHL3 and each of features included in the second branched hidden layer SHL2 may be 0. All weights between each of features included in the second branched hidden layer SHL2 and each of features included in the second output layer OL2 may be 0, and all weights between each of features included in the fourth branched hidden layer SHL4 and each of features included in the first output layer OL1 may be 0. That is, the first and third branched hidden layers SH1 and SH3 and subsequent layers may form separate deep learning models independent from each other.

In training, data with respect to a characteristic (e.g., a critical dimension) of a pattern may be input to the first branched hidden layer SH1, and for example, data with respect to wavelength correction coefficients $c_n$ of Equation 3 and data with respect to parameters $α'$ and $β'$ in which the angular misalignment of Equation 4 is compensated for, or the like, may be input to the third branched hidden layer SH3.

According to example embodiments, as the deep learning model DIM that imitates the domain simultaneously includes the auto encoder and the GAN, in the training, the accuracy of a weight between the input layer IL and the shared hidden layer CHL may be improved. Accordingly, the reliability of the deep learning model DIM that imitates the domain may be improved, and the reliability of a deep learning model trained based on a spectrum generated by the deep learning model DIM that imitates the domain may be improved.

In adding of a spectrum by the deep learning model DIM that imitates the domain, only the second output layer OL2 may be activated and a plurality of spectra based on a noise parameter change may be generated, but is not limited thereto.

Figure 6:
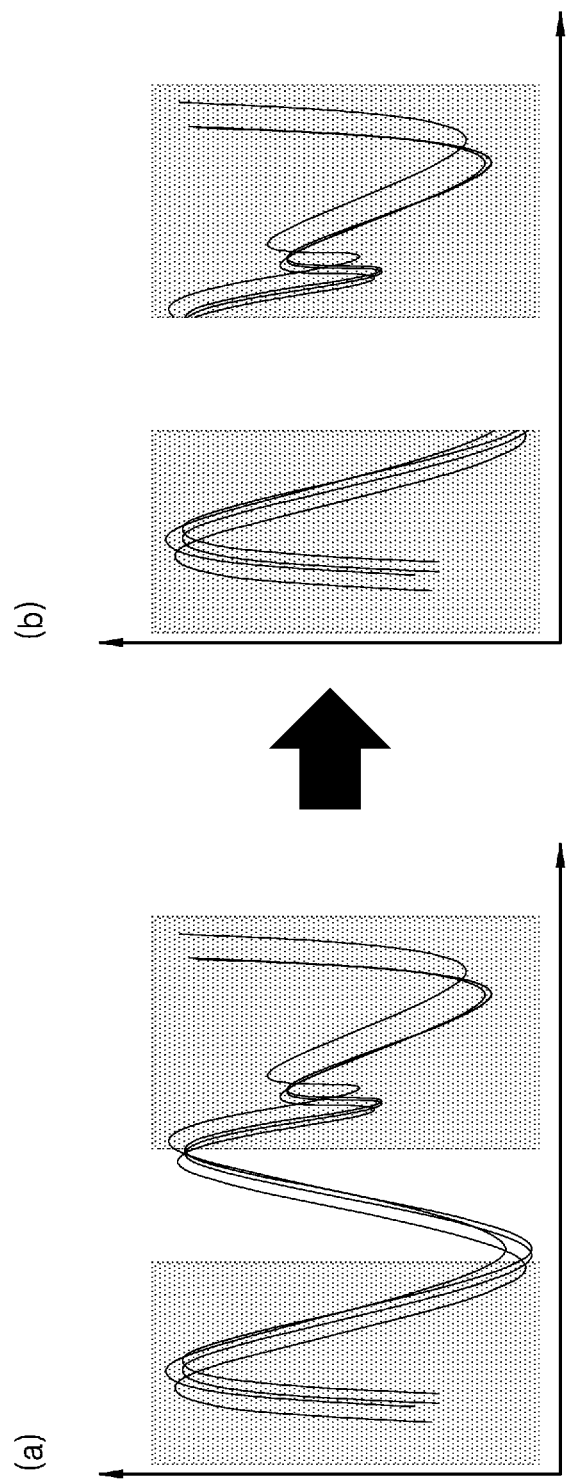
Figure 7:
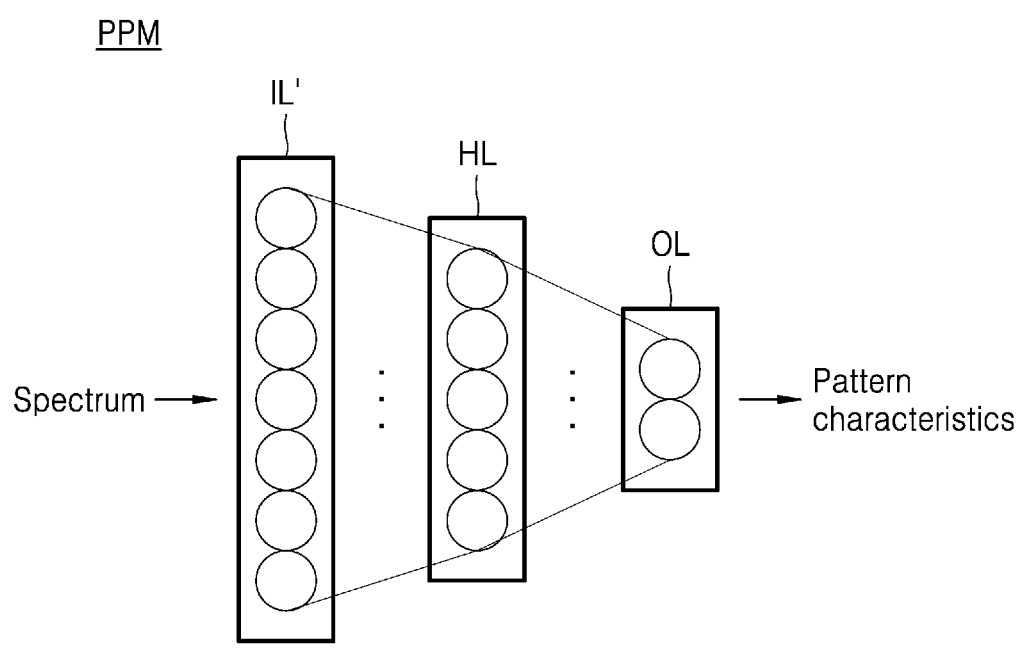

Referring to FIGS. 3 and 6, spectra for training may be trimmed in P130. The trimming of a spectrum may include separating, for each of the spectra for training, a wavelength band (shaded portions in FIG. 6) to be used for training of a deep learning model for predicting pattern characteristics and a wavelength band (non-shaded portions in FIG. 6) that will not be used for training. The separation of the wavelength band to be used for training of the deep learning model for predicting pattern characteristics and the wavelength bank that will not be used for training may be made through a lookup function with respect to data stored in the wafer inspection device 100 and/or comparison with offline data.

Referring to FIGS. 3 and 6, a deep learning model PPM for predicting pattern characteristics may be trained in P140.

The deep learning model PPM for predicting pattern characteristics may be trained by inputting spectra for training, which are trimmed in P130, and outputting a corresponding pattern characteristic (e.g., a critical dimension). The deep learning model PPM for predicting pattern characteristics may include an input layer IL' to which spectra for training, which are trimmed, are input, an output layer OL in which pattern characteristics (e.g., a critical dimension) corresponding to the spectra for training are output, and a hidden layer HL. Accordingly, as augmented spectra in a facility noise range from the original spectrum may correspond to the same pattern characteristics (e.g., a critical dimension), the deep learning model PPM for predicting pattern characteristics may be prevented from becoming too sensitive to facility noise due to overfitting.

Figure 8:
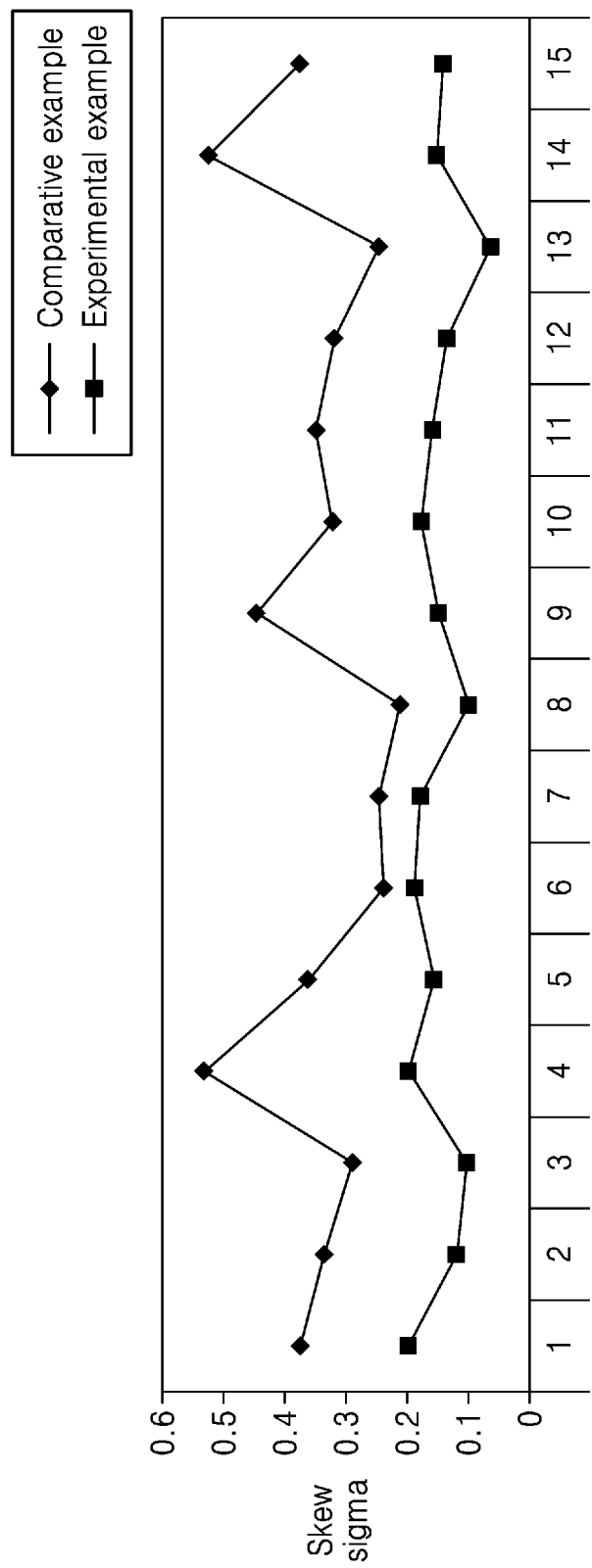
FIG. 8 is a graph for explaining an effect according to example embodiments.

FIG. 8 is a graph for explaining an effect according to example embodiments.

In detail, FIG. 8 illustrates a standard deviation of a difference between a pattern characteristic (e.g., a critical dimension) predicted by a deep learning model for predicting pattern characteristics according to a comparative embodiment and an actual pattern characteristic (e.g., a critical dimension) and a standard deviation of a difference between a pattern characteristic (e.g., a critical dimension) predicted by a deep learning model for predicting pattern characteristics according to an experimental embodiment and an actual pattern characteristic (e.g., a critical dimension). In FIG. 8, the horizontal axis represents an ordinal number for identifying different facilities, and the vertical axis represents the standard deviation of the difference between a standardized predicted pattern characteristic (e.g., the critical dimension) and an actual pattern characteristic (e.g., the critical dimension).

Referring to FIG. 8, the standard deviation of the difference between a predicted value by a deep learning model for predicting pattern characteristics according to the experimental embodiment and an actual value is less than a standard deviation of the difference between a predicted value by a deep learning model for predicting pattern characteristics according to the comparative embodiment and an actual value. Accordingly, it may be confirmed that the prediction ability of the deep learning model for predicting pattern characteristics according to the comparative example improved.

Figure 9:
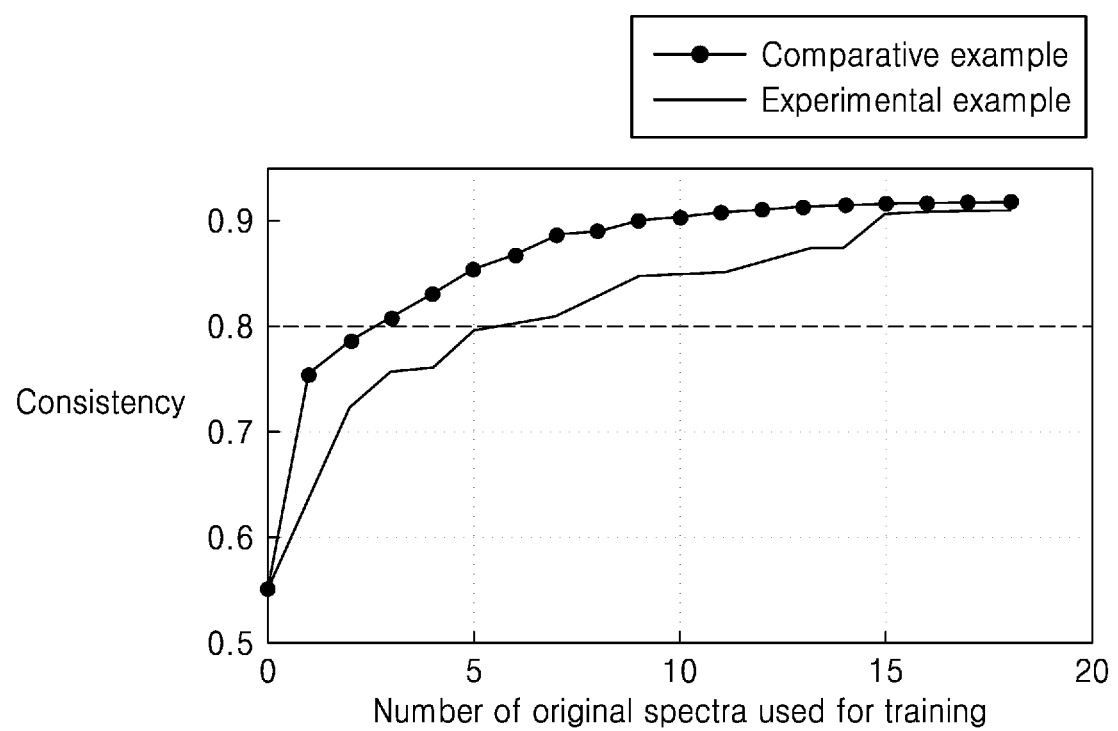
FIG. 9 is a graph for explaining an effect according to example embodiments.

FIG. 9 is a graph for explaining an effect according to example embodiments.

In detail, FIG. 9 shows the consistency of prediction according to the number of original spectra used in training for each of a deep learning model for predicting pattern characteristics according to a comparative embodiment and a deep learning model for predicting pattern characteristics according to an experimental embodiment. In FIG. 9, the horizontal axis represents the number of original spectra used for training, and the vertical axis represents a correlation coefficient between a predicted value and a measured value of a pattern characteristic (e.g. a critical dimension).

Referring to FIG. 9, compared to the prediction of the deep learning model for predicting pattern characteristics according to the comparative embodiment, it may be confirmed that the prediction of the deep learning model for predicting pattern characteristics according to the experimental embodiment has a higher consistency between the predicted value and the measured value. Furthermore, it may be confirmed that when sample number of the original spectrum used in training are small, the consistency of the deep learning model for predicting pattern characteristics according to the experiment example is relatively higher compared to the consistency of the deep learning model for predicting pattern characteristics according to the comparative example.

By way of summation and review, embodiments provide a method of training a deep learning model for predicting pattern characteristics, the deep learning model having improved reliability, and a method of manufacturing a semiconductor device. That is, to prevent overfitting of a deep learning model, a critical dimension prediction deep learning model is trained based on a plurality of augmented spectra sharing a critical dimension with an original spectrum, e.g., to account for systemic errors like misalignments. Accordingly, the deep learning model may be prevented from being too sensitive to facility noise, e.g., noise due to systematic error, thereby improving accuracy and precision.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a pattern on a wafer;
    measuring a spectrum of the pattern on the wafer, with a spectral optical system;
    performing an analysis of the spectrum through a deep learning model for predicting pattern characteristics; and
    evaluating the pattern on the wafer based on the analysis of the spectrum,
    wherein the deep learning model for predicting pattern characteristics is trained based on training data including both an original spectrum measured by the spectral optical system and augmented spectra generated based on a domain knowledge and the original spectrum.

2. The method as claimed in claim 1, wherein the domain knowledge includes a noise inducing factor of the spectral optical system.

3. The method as claimed in claim 2, wherein the spectral optical system includes:
    a spectral ellipsometer having a light source configured to generate an incident beam;
    a polarizer on a path of the incident beam between the light source and the wafer;
    a plurality of detectors configured to detect a reflected beam generated by reflection of the incident beam from the wafer; and
    an analyzer on a path of the reflected beam between the plurality of detectors and the wafer.

4. The method as claimed in claim 3, wherein the augmented spectra include first augmented spectra generated through a wavelength modification modeling with respect to at least one original spectrum of the pattern on the wafer and second augmented spectra generated through an angular modeling with respect to the at least one original spectrum of the pattern on the wafer.

5. The method as claimed in claim 4, wherein the wavelength modification modeling is based on a detector misalignment, the detector misalignment comprising a misalignment of the plurality of detectors.

6. The method as claimed in claim 4, wherein the wavelength modification modeling is performed based on the following equation, $$\delta\lambda = \sum_{n=0}^{n=N} c_n \lambda^n$$

wherein $\lambda$ is a wavelength, $c_n$ is a correction coefficient according to a power of the wavelength, and $\delta\lambda$ is a difference between a measured value and an actual value according to the wavelength $\lambda$, and
wherein the first augmented spectra are generated by arbitrarily selecting a value of the correction coefficient $c_n$.

7. The method as claimed in claim 4, wherein the angular modeling is based on an angular alignment error between the polarizer and the analyzer.

8. The method as claimed in claim 4, wherein the second augmented spectra are generated by arbitrarily selecting an angular alignment error between the polarizer and the analyzer.

9. The method as claimed in claim 4, wherein the deep learning model for predicting pattern characteristics is trained by using the pattern characteristics as a common output for the original spectrum, the first augmented spectra, and the second augmented spectra.

10. A method of training a deep learning model for predicting pattern characteristics, the method comprising:
    after forming a pattern on a wafer, measuring an original spectrum of the pattern on the wafer and a critical dimension of the pattern corresponding to the original spectrum;
    generating augmented spectra based on the original spectrum and a domain knowledge;
    selecting a wavelength band to be used for the training of the deep learning model for predicting pattern characteristics with respect to the original spectrum and the augmented spectra; and
    training the deep learning model for predicting pattern characteristics by using both the original spectrum and the augmented spectra as an input and using the critical dimension of the pattern as an output.

11. The method as claimed in claim 10, wherein the domain knowledge includes a noise inducing factor with respect to the original spectrum.

12. The method as claimed in claim 10, wherein generating the augmented spectra includes arbitrarily changing modeling parameters for compensating for a noise inducing factor of a spectral optical system configured to measure the original spectrum.

13. The method as claimed in claim 10, wherein generating the augmented spectra is performed by a deep learning model that imitates a domain, the deep learning model that imitates the domain including a generative adversarial network (GAN).

14. The method as claimed in claim 13, wherein:
the deep learning model that imitates the domain further includes an auto encoder outputting an additional spectrum that is the same as the original spectrum, the auto encoder and the GAN being activated when training the deep learning model that imitates the domain, and
generating the augmented spectra is performed by the GAN.

15. The method as claimed in claim 14, wherein the deep learning model that imitates the domain includes:
an input layer to which the original spectrum is input;
a first output layer through which a result of the auto encoder is output;
a second output layer through which the augmented spectra are output;
a shared hidden layer associated with features of the input layer; and
first and second branched hidden layers branched from the shared hidden layer,
wherein weights of each of features included in the first branched hidden layer and each of features included in the second output layer are 0.

16. The method as claimed in claim 15, wherein weights of each of features included in the second branched hidden layer and each of features included in the first output layer are 0.

17. The method as claimed in claim 15, wherein, when training the deep learning model that imitates the domain, data with respect to the critical dimension of the pattern is input to the first branched hidden layer, and data with respect to a noise inducing factor is input to the second branched hidden layer.

18. A method of manufacturing a semiconductor device, the method comprising:
training a deep learning model for predicting pattern characteristics based on a domain knowledge;
forming a pattern on a wafer;
measuring, with a spectral optical system, a spectrum of the pattern on the wafer;
performing an analysis of the spectrum through the deep learning model for predicting pattern characteristics; and
evaluating the pattern on the wafer based on the analysis of the spectrum,
wherein the training of the deep learning model for predicting pattern characteristic is performed based on training data including both an original spectrum measured by the spectral optical system and augmented spectra generated based on the domain knowledge.

19. The method as claimed in claim 18, wherein the spectral optical system includes:
a spectral ellipsometer with a light source configured to generate an incident beam;
a polarizer arranged on a path of the incident beam between the light source and the wafer;
a plurality of detectors configured to detect a reflected beam generated by reflection of the incident beam by the wafer; and
an analyzer arranged on a path of the reflected beam between the plurality of detectors and the wafer.

20. The method as claimed in claim 18, wherein the domain knowledge includes a noise inducing factor of the spectral optical system.

* * * * *